United States Patent
Vaufredaz

(10) Patent No.: US 8,314,007 B2
(45) Date of Patent: Nov. 20, 2012

(54) PROCESS FOR FABRICATING A HETEROSTRUCTURE WITH MINIMIZED STRESS

(75) Inventor: Alexandre Vaufredaz, La Murette (FR)

(73) Assignee: Soitec, Bernin (FR)

(*) Notice: Subject to any disclaimer, the term of this patent is extended or adjusted under 35 U.S.C. 154(b) by 0 days.

(21) Appl. No.: 12/943,693

(22) Filed: Nov. 10, 2010

(65) Prior Publication Data

US 2011/0151644 A1   Jun. 23, 2011

(30) Foreign Application Priority Data

Dec. 23, 2009 (FR) ...................................... 09 59473

(51) Int. Cl.
H01L 21/30 (2006.01)
H01L 21/46 (2006.01)

(52) U.S. Cl. ................. 438/455; 438/459; 257/E21.087

(58) Field of Classification Search .................. 438/455, 438/459; 257/E21.087
See application file for complete search history.

(56) References Cited

U.S. PATENT DOCUMENTS

| | | | | |
|---|---|---|---|---|
| 5,032,544 A | * | 7/1991 | Ito et al. | 438/459 |
| 5,340,435 A | * | 8/1994 | Ito et al. | 438/459 |
| 5,937,312 A | * | 8/1999 | Iyer et al. | 438/459 |
| 7,902,045 B2 | * | 3/2011 | Arena et al. | 438/459 |
| 2002/0068396 A1 | * | 6/2002 | Fitzergald | 438/200 |
| 2003/0008478 A1 | | 1/2003 | Abe et al. | 438/459 |
| 2003/0062111 A1 | | 4/2003 | Moriya | 156/89.12 |
| 2005/0101104 A1 | | 5/2005 | Schwarzenbach et al. | 438/458 |
| 2005/0103713 A1 | * | 5/2005 | Ramsey et al. | 210/649 |
| 2006/0208341 A1 | * | 9/2006 | Atwater et al. | 257/616 |
| 2009/0095399 A1 | | 4/2009 | Zussy et al. | 156/60 |

FOREIGN PATENT DOCUMENTS

| | | |
|---|---|---|
| CN | 1688014 A | 10/2005 |
| CN | 101084577 A | 12/2007 |
| EP | 0 856 876 A2 | 8/1998 |
| EP | 0 964 436 A2 | 12/1999 |
| EP | 1542 275 A1 | 6/2005 |
| FR | 2 935 535 | 3/2010 |
| WO | WO 2010/026006 A1 | 3/2010 |

OTHER PUBLICATIONS

Sanz-Velasco et al., "Room Temperature Wafer Bonding Using Oxygen Plasma Treatment in Reactive Ion Etchers With and Without Inductively Coupled Plasma,", Journal of the Electrochemical Society, vol. 150, No. 2, pp. G155-G162 (2003).
Search Report for French application No. FR 0959473 dated Aug. 16, 2010.
Search Report for European application No. EP 10192594 dated Jan. 10, 2011.
Search Report, Singapore Application No. 201007705-5 dated Jun. 4, 2011.

* cited by examiner

Primary Examiner — Charles Garber
Assistant Examiner — Ron Pompey
(74) Attorney, Agent, or Firm — Winston & Strawn LLP

(57) ABSTRACT

A process for fabricating a heterostructure by bonding a first wafer to a second wafer, with the first wafer having a thermal expansion coefficient that is lower than the thermal expansion coefficient of the second wafer, and conducting at least one bond-strengthening annealing step. After the bonding step and before the bond-strengthening annealing step, at least one trimming step is conducted in which the first wafer is at least partially trimmed.

18 Claims, 8 Drawing Sheets

PROCESS FOR FABRICATING A HETEROSTRUCTURE WITH MINIMIZED STRESS

BACKGROUND

The present invention relates to the fabrication of heterostructures formed by bonding a first wafer or substrate to a second wafer or substrate, the first wafer having a thermal expansion coefficient that is lower than the thermal expansion coefficient of the second wafer. Such heterostructures are particularly used in microelectronics or optoelectronics. The invention is particularly applicable to the fabrication of SOS heterostructures, where SOS stands for silicon-on-sapphire ($Al_2O_3$).

During the assembly of two wafers having different thermal expansion coefficients, for example different by at least 10% or 20% at room temperature (20° C.), or during any subsequent processing of the two assembled wafers, there may be times when the assembly is subjected to increased temperatures, for example, during heat treatments such as those conventionally conducted to strengthen the bond interface in the case of a bond-strengthening anneal.

FIG. 1 illustrates the behaviour of a heterostructure during a bond-strengthening anneal carried out at a temperature of about 160° C., the heterostructure being formed by bonding a first wafer or substrate 10 corresponding to an SOI (silicon-on-insulator) structure to a sapphire second wafer or substrate 20. As shown in FIG. 1, the difference between the thermal expansion coefficient (TEC) of silicon, the principal component of the SOI structure, and that of sapphire (Si TEC<$Al_2O_3$ TEC) leads, during a heat treatment, to a deformation of the assembly such that high debonding stresses $C_d$ are applied in regions $Z_d$ located at the edges of the heterostructure.

Because of these stresses there is insufficient transfer at the edge of the wafers, leading to the appearance of a ring (a region in which the first wafer has not transferred onto the second wafer) that is too large and irregularly shaped and that can, in particular, lead to the wafer edges peeling off.

In the case of heterostructures such as SOS heterostructures, the latter are fabricated by assembling a structure, for example an SOI structure, onto a support wafer or substrate such as a sapphire substrate. In this case, the fabrication of the SOS heterostructure comprises the direct wafer bonding or a fusion bonding of the SOI structure to the sapphire wafer, a bond-stabilizing or bond-strengthening anneal and a thinning of the SOI structure to form a silicon layer transferred onto the sapphire wafer. The thinning is typically carried out in two steps, namely a first, grinding step of removing most of the support substrate of the SOI structure followed by a second step of chemically etching as far as the oxide layer of the SOI structure, the oxide layer playing the role of stop layer. The chemical etch is typically carried out using a TMAH (tetramethylammonium hydroxide).

The generation of debonding stresses at the edge of substrates, as explained above, may lead to debonding at the edges of the silicon layer and the sapphire substrate allowing the wet etchant to infiltrate into the bond interface during thinning. This infiltration further weakens the bond and can lead to delamination of the structure as shown in FIG. 2 where a delamination of the silicon surface layer from the underlying sapphire substrate or wafer is observed when a shear stress is applied to the silicon layer.

Finally, as shown in FIG. 3, edge loss, i.e., the enlargement of the ring due to delamination, is already present after grinding. Edge loss is due to delamination during the bond-strengthening anneal and is all the larger because, during the bond-strengthening anneal, the silicon is relatively thick.

Accordingly, improvements in the fabrication of heterostructures are needed to avoid these problems, and the present invention now provides such improved processes.

SUMMARY OF THE INVENTION

One embodiment of the invention is to alleviate the aforementioned drawbacks by providing a solution enabling a heterostructure to be fabricated by bonding a first wafer or substrate to a second wafer or substrate, with the first wafer having a thermal expansion coefficient that is lower than the thermal expansion coefficient of the second wafer, while limiting the debonding and the appearance of defects at the substrate edges.

For this purpose, the present invention provides a process for fabricating such a heterostructure in which, after the bonding and before conducting the bond-strengthening anneal, the first wafer is at least partially trimmed. The at least partial trimming of the first wafer allows the peripheral thickness of the latter to be reduced and, consequently, the magnitude of the debonding stresses, due to the difference between the thermal expansion coefficients of the two wafers, to also be reduced. Thus the width and the regularity of the ring, that is to say the non-transferred region at the edge of the substrates, is significantly improved.

According to one implementation of the process of the invention, a single trimming step is carried out, after which the first wafer has, in its trimmed portion, a thickness smaller than or equal to 55 µm, and then a single bond-strengthening annealing step is carried out at a temperature of about 150 to 200° C. for a time of about 1 to 3 hours.

According to another implementation of the process of the invention, the process comprises first and second partial trimming steps in which the first wafer is at least partially trimmed in the first trimming step. In this implementation, the first trimming step is carried out after the first annealing step and before the first annealing step, whereas the second trimming step is carried out after the first annealing step but before the second annealing step. This implementation enables trim depths to be reached that could not be reached using a single trimming step without risking peel-off or delamination of the wafers.

Because of the partial reduction in the debonding stresses by virtue of the first and second trimming steps, the second bond-strengthening annealing step may be carried out at a higher temperature than the first bond-strengthening annealing step.

The process of the invention is particularly applicable to the fabrication of an SOS structure. In this case, the process uses a silicon or SOI substrate as first wafer and a sapphire substrate as second wafer.

According to one aspect of the invention, the process furthermore comprises, after the bond-strengthening annealing step or steps, a step of thinning the first wafer, the thinning being carried out by grinding followed by etching of the first wafer. The grinding is carried out using a grinding wheel the work surface of which comprises abrasive particles having an average size larger than 6.7 microns.

Using, for the grinding, a grinding wheel comprising abrasive particles having an average size larger than 6.7 microns gives coarse grinding, as compared to fine grinding achieved when a wheel comprising abrasive particles having an average size smaller than 6.7 microns is used.

The Applicant has chosen to use such coarse grinding because it allows the first wafer to be thinned whilst minimizing the risk of delamination of the wafers during grinding. By grinding with abrasive particles having an average size larger than 6.7 microns, it is possible to remove a larger amount of material without requiring the application of too great a contact force. During grinding, the contact force of the wheel on the first wafer is no greater than 222.5 newtons. On the other hand, using smaller abrasive particles, corresponding to fine grinding, the area ratio between the fine wheel and the material is greater than between the coarse wheel and this same material, increasing the contact force of the wheel on the first wafer and consequently increasing the risk of delamination.

BRIEF DESCRIPTION OF THE DRAWINGS

Other features and advantages of the invention will become clear from the following description of particular embodiments of the invention, given by way of non-limiting example and with reference to the appended drawings, in which.

DETAILED DESCRIPTION OF THE INVENTION

The process of the present invention is applicable, in general, to the fabrication of heterostructures comprising at least two wafers having respectively different thermal expansion coefficients (for example, silicon-on-sapphire, silicon-on-glass, etc.). Wafers are assembled together using direct wafer bonding or any other type of bonding, such as anodic, metallic or adhesive bonding. The wafers are generally circular and may have various diameters, particularly diameters of 100 mm, 150 mm, 200 mm or 300 mm.

Components may have already been formed in one of the wafers which is then bonded to the other wafer that acts as a support. These components are particularly elements forming all or part of an electronic component or a plurality of microelectronic components, such as circuits or contacts or even active layers.

More generally, the invention is particularly applicable to assembled structures that are unable to withstand a high-temperature bonding anneal, as well as to heterostructures formed from an assembly of wafers having different thermal expansion coefficients.

The invention is more particularly applicable, but not exclusively so, to SOS (silicon-on-sapphire) heterostructures formed from an assembly of a first wafer or substrate made of sapphire and a second wafer or substrate comprising silicon such as an SOI structure.

Heterostructures comprising a silicon layer on a sapphire substrate have particular advantages. SOS structures enable the fabrication of high-frequency, low power-consumption devices. Sapphire substrates furthermore dissipate heat very well, better than quartz substrates, for example.

FIGS. 4A to 4G and FIG. 5 show a process for fabricating an SOS heterostructure from a first or initial substrate 110 (Top) and a second support wafer of substrate 120 (Base).

Figure 1:
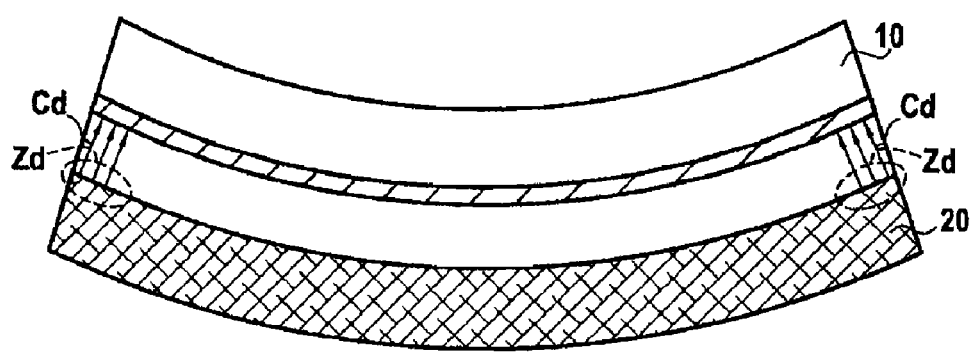
FIG. 1 is a schematic cross section showing the stresses in an SOS heterostructure during a bond-strengthening heat treatment according to the prior art.
Figure 2:
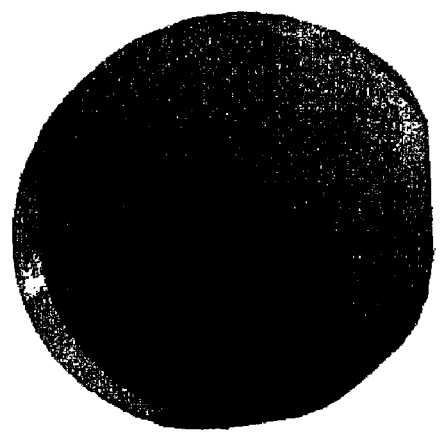
FIG. 2 is a photograph showing the conventional delamination of a silicon-on-sapphire heterostructure.
Figure 3:
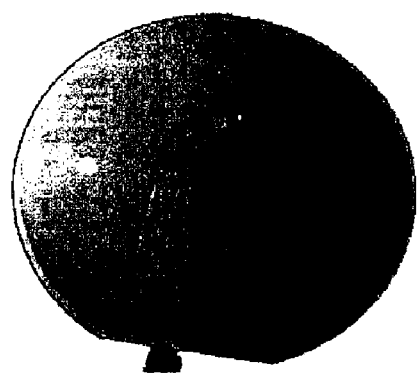
FIG. 3 is a photograph showing conventional edge loss and cruciform cracks in a silicon-on-sapphire heterostructure after grinding.
Figure 4A:
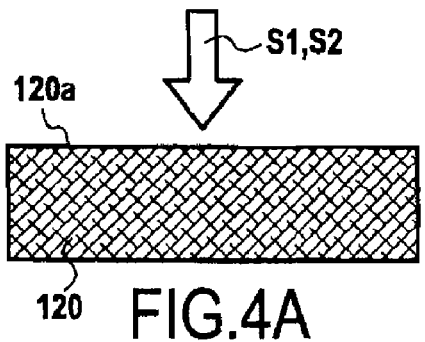
FIGS. 4A to 4H are schematic views showing the fabrication of a heterostructure implementing a process according to one embodiment of the invention.
Figure 4B:
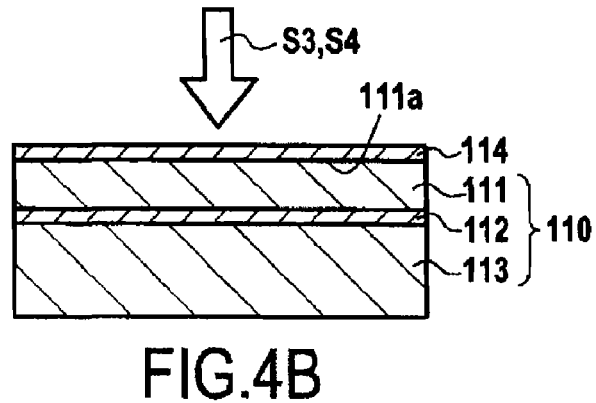

As FIG. 4B shows, the first wafer 110 consists of an SOI structure comprising a silicon layer 111 on a support 113 also made of silicon, a buried oxide layer 112, for example made of $SiO_2$, being placed between the layer 111 and the support 113.

The second wafer 120 is a sapphire wafer (FIG. 4A).

Before bonding the first wafer 110 to the second wafer 120, the bonding surface 120a may be prepared (step S1). This preparation may particularly consist in a chemical clean particularly an RCA clean (namely the combination of an SC1 ($NH_4OH$, $H_2O_2$, $H_2O$) bath designed to remove particles and hydrocarbons and an SC2 (HCl, $H_2O_2$, $H_2O$) bath designed to remove metallic contaminants), a CARO or Piranha clean ($H_2SO_4$:$H_2O_2$) or even an ozone/water ($O_3$/$H_2O$) clean. The cleaning may be followed by scrubbing in a scrubber.

So as to further increase the bonding energy, the surface 120a of the second wafer 120 may be activated using a plasma treatment (step S2).

The surface 111a of the silicon layer 111 of the first wafer 110 may be covered with a thermal oxide layer 114 formed, for example, by oxidation of the surface of the wafer (FIG. 4B, step S3).

The surface 111a, whether or not covered with an oxide layer, may also be activated using a plasma treatment (step S4). The activation of the bonding surfaces of the substrates 110 and 120 may be carried out by exposing them to a plasma based on oxygen, nitrogen, argon, etc. The equipment used for this purpose may be, amongst other types, equipment initially intended to carry out capacitively-coupled RIE (reactive ion etching) or ICP (inductively-coupled plasma) RIE. For further details, reference may be made, for example, to the publication of Sanz-Velasco et al. entitled "Room temperature wafer bonding using oxygen plasma treatment in reactive ion etchers with and without inductively coupled plasma" (Journal of the Electrochemical Society, 150, G155, 2003).

These plasmas may furthermore be contained by a magnetic field, particularly to avoid loss of charged species to the sidewalls of the reactor, by virtue of MERIE (magnetically-enhanced reactive ion etching) equipment.

The density of the plasma may be chosen to be low, medium or high (or HDP for high-density plasma).

In practice, plasma activation of the bond generally comprises a prior chemical clean, such as an RCA clean (namely the combination of an SC1 ($NH_4OH$, $H_2O_2$, $H_2O$) bath designed to remove particles and hydrocarbons and an SC2 (HCl, $H_2O_2$, $H_2O$) bath designed to remove metallic contaminants), followed by exposure of the surface to a plasma for a few seconds to a few minutes.

On or more post-plasma exposure cleans may also be implemented, particularly to remove contaminants introduced during exposure, such as rinsing in water and/or an SC1 clean, optionally followed by a centrifugal drying. However, these cleans may be replaced by scrubbing in a scrubber that removes a significant proportion of these contaminants.

The activation of a bonding surface using a plasma treatment is well known to those skilled in the art and will not be described in further detail here for the sake of simplicity.

Figure 4C:
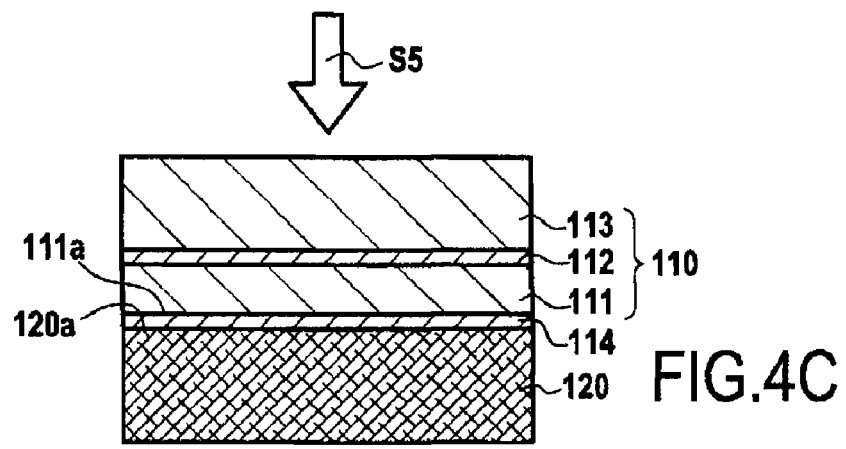

Once prepared, the surface 111a (here covered with an oxide layer 114) and the surface 120a are placed in intimate contact and pressure is applied to one of the two wafers so as to initiate the propagation of a bonding wave between the surfaces in contact (step S5, FIG. 4C).

As is well known per se, the principle of direct wafer bonding, or just direct bonding, is based on direct contact between two surfaces—that is to say that no specific material (adhesive, wax, braze, etc.) is used. To carry out such an operation, it is necessary for the bonding surfaces to be sufficiently smooth, particle- and contamination-free, and for the bonding surfaces to be brought sufficiently close to each other so that a contact is initiated—typically a separation of less than a few nanometers is required. In this case, the attractive forces between the two surfaces are strong enough that direct bonding occurs i.e. bonding induced by the Van der Waals forces between the atoms or molecules of the two surfaces to be bonded.

According to the invention, before a bond-strengthening anneal is carried out, a step in which the first wafer is at least partially trimmed, that is to say in which an annular portion of the first wafer, located on the periphery or edge of the latter, and extending through all or part of the thickness of the first wafer, is removed (step S6, FIG. 4D) is carried out.

Figure 4D:
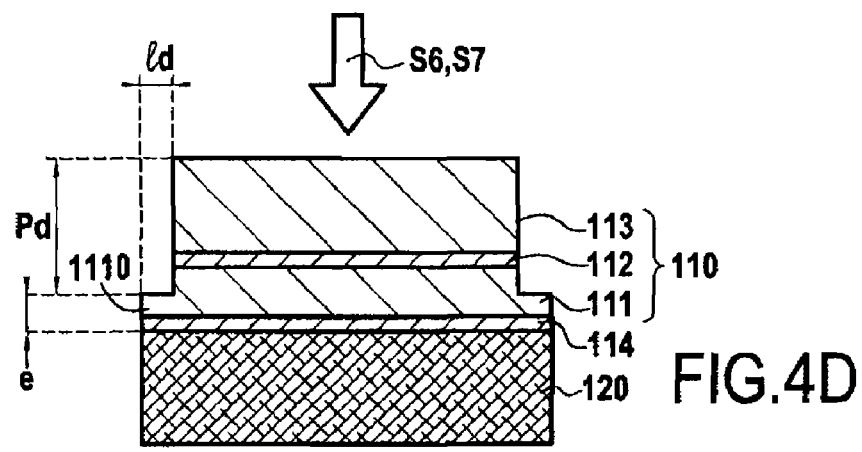

As shown in FIG. 4D, the trimming is carried out over a width Id from the edge of the first wafer 110. For wafers of 100 mm, 200 mm and 300 mm diameter, the width Id of the trim is generally between 2 mm and 10 mm and preferably between 2 mm and 6 mm.

The trim is mainly achieved by edge grinding of the top side of the first wafer 110. The edge grinding may be carried out using a grinding wheel or any other tool capable of mechanically wearing away the material of the layer.

The trimming may be "gradual", that is to say carried out in at least two steps, namely a first trimming step carried out very close to the edge of the wafer and a second trimming step carried out further from the edge of the first wafer.

Furthermore, the trim may be "hybrid", that is to say it may comprise one or more first, entirely mechanical step(s) (grinding, abrasion, lapping, etc.) for limited trimming of the edge of the first wafer to a predetermined depth followed by a second trimming step carried out using at least partially non-mechanical means, that is to say means that do not rely solely on mechanical rubbing on the wafer—such as chemical etching, also called wet etching, reactive ion etching, also called plasma etching or dry etching, or a chemical-mechanical polishing (CMP).

In the case of gradual or hybrid trimming, the heating and/or stresses responsible, in particular, for macropeeling and micropeeling of the wafer edges, is/are limited.

During the trimming, the first wafer 110 is removed to a depth Pd defined from a reference plane corresponding to the bond interface (here the contact plane between the thermal oxide layer 114 and the bonding face 120a of the second wafer 120). The depth Pd is chosen so as to remove, at the edge of the first wafer, all or part of the thickness of the latter. In the example given here, the trim depth Pd is chosen so that, at the edge of the first wafer, an annular portion 1110 of a reduced thickness e remains after trimming. According to the invention, the thickness e of the annular portion formed after a partial trim is smaller than or equal to 55 µm, below which thickness the debonding stress applied at the wafer edge begins to be significantly reduced.

After the trimming and before the thinning of the first wafer 110, the bond is strengthened using what is called a bond-strengthening anneal (step S7). The bond-strengthening anneal is carried out at a treatment temperature of preferably about 160° C. for a time of about 2 hours. This anneal reduces the appearance of ring defects (non-transferred peripheral regions) and prevents delamination of the two wafers during the thinning step.

During the bond-strengthening anneal, the boat-in temperature of the assembly formed by bonding of the first wafer 110 to the second wafer 120 is preferably lower than 80° C., for example 50° C. Once the assembly is placed in the annealing oven the temperature ramp-up, that is to say the rate of temperature rise that takes the temperature of the oven from the boat-in temperature up to the actual bond-strengthening anneal temperature is preferably about 1° C./min. Controlling the boat-in temperature and the temperature ramp-up helps to reduce the thermal stresses applied to the assembly during annealing.

The fabrication of the heterostructure continues with the thinning of the first wafer 110 so that a transferred layer corresponding to a portion of said first wafer is formed.

Figure 4E:
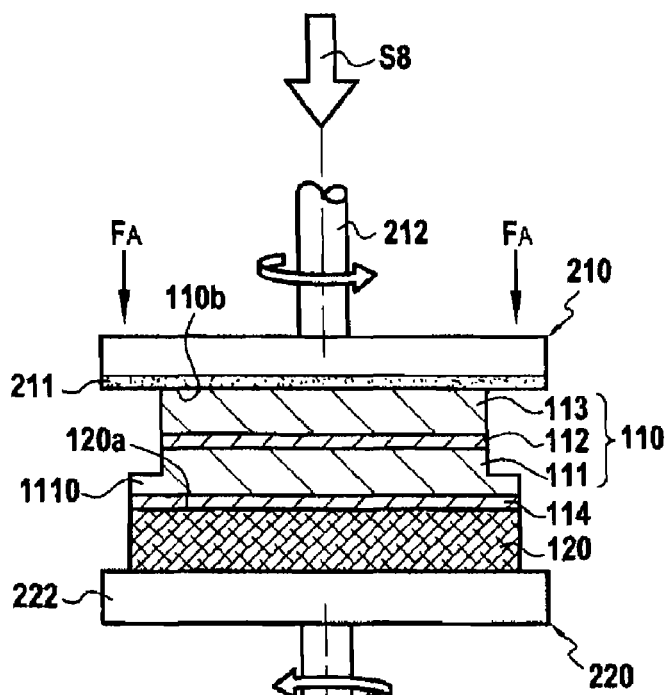
Figure 4F:
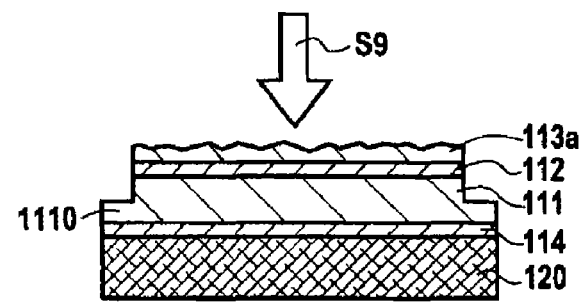

The thinning is carried out firstly by grinding away most of the support 113 (step S8, FIG. 4E). According to the invention, the grinding is carried out using what is called a "coarse" grinding wheel 210, that is to say a wheel the grinding surface or active grinding part 211 of which comprises abrasive particles having an average size larger than 6.7 microns (or 2000 mesh), preferably larger than or equal to 15 microns (or 1000 mesh), and even more preferably larger than or equal to 31 microns (or 500 mesh). The abrasive particles may be particularly diamond particles. By way of example, the reference of a wheel model sold by Saint-Gobain comprising abrasive diamond particles of a 6.7 micron (or 2000 mesh) average size is: FINE WHEEL STD—301017:18 BB-11-306-B65JP-5MM 11,100×1,197×9,002 MC176261 69014113064 POLISH#3JP1,28BX623D-5MM. The reference of a wheel model sold by Saint-Gobain comprising abrasive diamond particles of a 44 micron (or 325 mesh) average size is: COARSE WHEEL STD—223599:18BB-11-32B69S 11,034×1-⅛×9,001 MD15219669014111620 COARSE #3R7B69-⅛.

During the grinding, the two-wafer assembly is secured by the back side of the support substrate 120 using a chuck 220 comprising a plate 222 designed to secure the second wafer 120 using, for example, suction or an electrostatic system. During the grinding, the chuck 220 may be stationary whilst the wheel 210 is rotated about its axis 212. Alternatively, the chuck 220 may also rotate about an axis 221, the wheel 210 being made to rotate or not.

The grinding is carried out by keeping the active grinding surface 211 of the wheel 210 against the exposed face 110b of the first wafer 110. Because of the large size of the abrasive particles, the material of the first wafer 110 may be efficiently removed without having to apply the wheel 210 with an excessively large contact force FA on the assembly, reducing the risk that the two bonded wafers will delaminate. For a wheel the surface or active grinding part of which comprises abrasive particles having an average size of 6.7 microns (or 2000 mesh), the maximum contact force is about 222.5 newtons (50 lbs). This maximum contact force decreases with the increase in size of the abrasive particles. For example, for a wheel the surface or active grinding part of which comprises abrasive particles having an average size of 44 microns (or 325 mesh), the maximum contact force is about 133.5 newtons (30 lbs).

The grinding is stopped about 65 µm from the surface 120a of the sapphire support substrate.

At this stage of the thinning, that is to say before the second, chemical thinning step, a post-grinding anneal may be carried out (step S9, FIG. 4F) so as to strengthen the bond and stop infiltration of the wet etchant into the bond interface during the second thinning step. Because a coarse grinding wheel is used during the grinding, the remaining part 113a of the support 113 has a work-hardened surface (FIG. 4F) which causes cracks to appear. To prevent the appearance of cracks, the post-grinding anneal is limited to a temperature of between 150° C. and 170° C. The post-grinding anneal is carried out for a time of between 30 minutes and 4 hours.

Figure 4G:
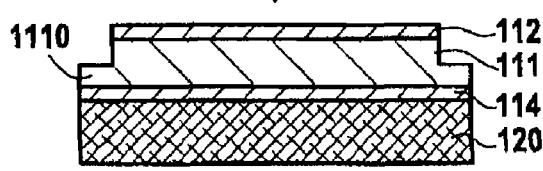

The thinning of the initial substrate continues with an etch of the remaining portion 113a (step S10, FIG. 4G). This portion may be removed by chemical etching, also called wet etching, for example, by means of a TMAH (tetramethylammonium hydroxide) wet etch.

The remaining portion 113a may also be removed by means of reactive ion etching, also called a plasma etching or a dry etching. This etching technique is well known to those skilled in the art. It will be recalled that a reactive ion etch is a physical-chemical etch that involves both ion bombardment and a chemical reaction of the ionized gas with the surface of the wafer or the layer to be etched. The atoms of the gas react with the atoms of the layer or wafer to form a volatile new species that is removed by a pumping device.

Figure 4H:
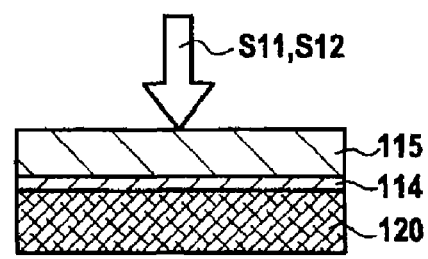
Figure 5:
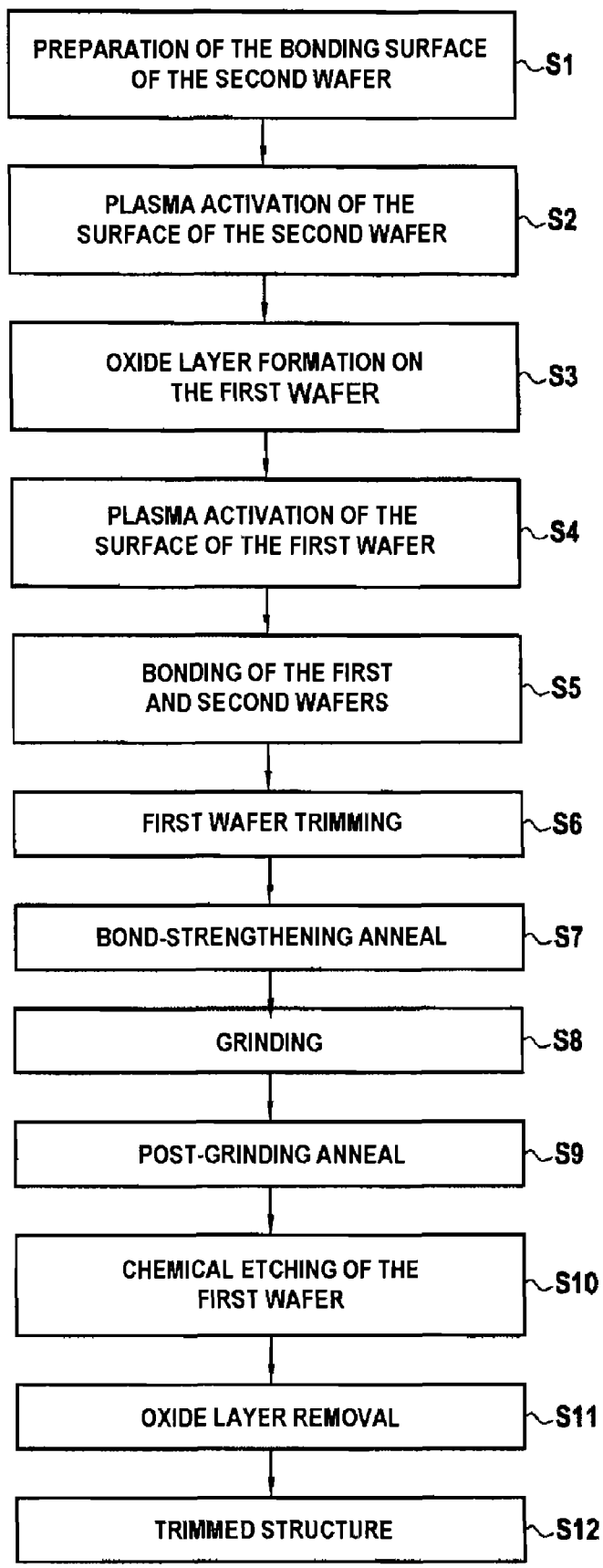
FIG. 5 is a flow diagram of the steps implemented during the fabrication of the heterostructure illustrated in FIGS. 4A to 4H.

The oxide layer 112 is used as an etch-stop layer. After the etch, the layer 112 may be removed (step S11, FIG. 4H), for example by HF deoxidation, so as to leave a transferred layer 115 corresponding to at least one part of the silicon layer 111. However, if required, the oxide layer 112 may be preserved.

Another implementation of the process of the invention will now be described with reference to FIGS. 6A to 6I and FIG. 7, this implementation being different to that described above in relation to FIGS. 4A to 4H and FIG. 5 in that the trimming of the first wafer and the bond-strengthening anneal are both carried out in two steps.

Figure 6A:
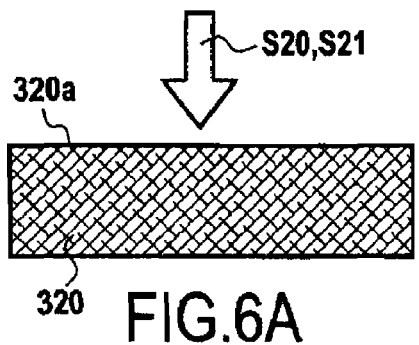
FIGS. 6A to 6I are schematic views showing the fabrication of a heterostructure implementing a process according to another embodiment of the invention.
Figure 6B:
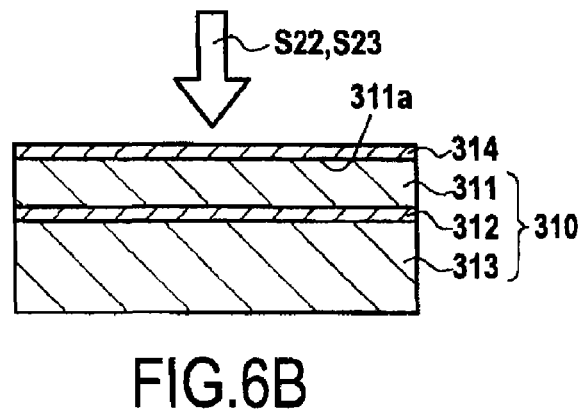

As described above, use is made of a first wafer 210 consisting of an SOI structure comprising a silicon layer 311 on a support 313 also made of silicon, a buried oxide layer 312 being placed between the layer 311 and the support 313 (FIG. 6B), and a second, sapphire wafer 320 (FIG. 6A).

Before bonding the wafers, the bonding surface 320a of the second wafer 320 may be prepared (step S20) and activated using a plasma treatment (step S21) whereas the surface 311a of the silicon layer 311 of the first wafer 310 may be covered with a thermal oxide layer 314 (FIG. 6B, step S22) and activated using a plasma treatment (step S23), these treatments being carried out under the same conditions described above.

Figure 6C:
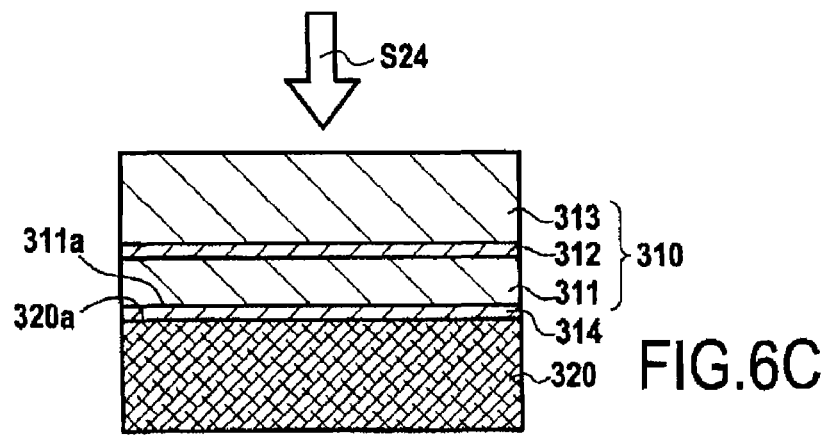

The first and second wafers 310 and 320 are then bonded by placing the surface 311a (here covered with the oxide layer 314) in intimate contact with the surface 320a and by applying pressure to one of the two wafers so as to initiate the propagation of a bonding wave between the surfaces in contact (step S24, FIG. 6C)

Figure 6D:
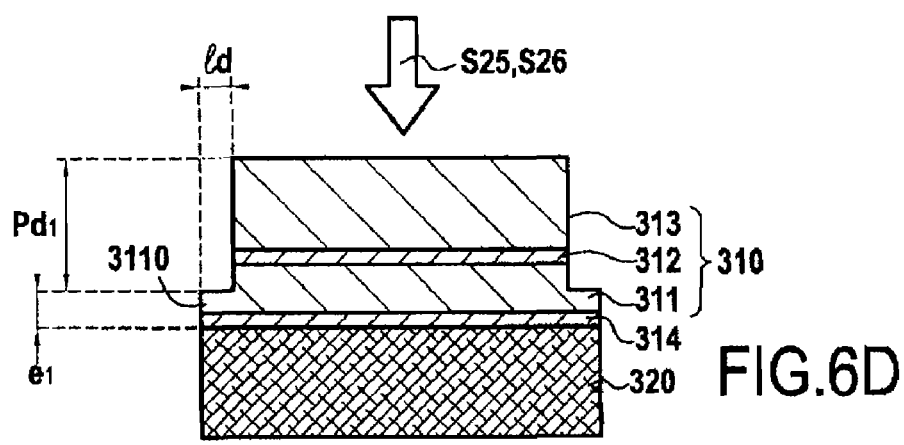

The trim is started using a first trimming step carried out in the first wafer 310 over a width Id and to a depth Pd1 so that, at the edge of the first wafer, an annular portion 3110 of a reduced thickness e1 remains after trimming (step S25, FIG. 6D). The thickness e1 of the annular portion formed after this first trim is preferably smaller than or equal to 50 μm, below which thickness the debonding stress applied at the wafer edge begins to be significantly reduced.

After this first trimming step, a first bond-strengthening annealing step (step S26) is carried out. Because the trimming of the first wafer 310 has not yet been completed, this first bond-strengthening anneal is carried out at a moderate temperature. The temperature of this first anneal depends on the thickness e1 of the annular portion 3110 that remains after the first trimming step. The smaller this thickness, the higher the anneal temperature can be. This first annealing step may be carried out at a temperature of between 180° C. and 200° C. and for a time of between 30 minutes and 4 hours.

Figure 6E:
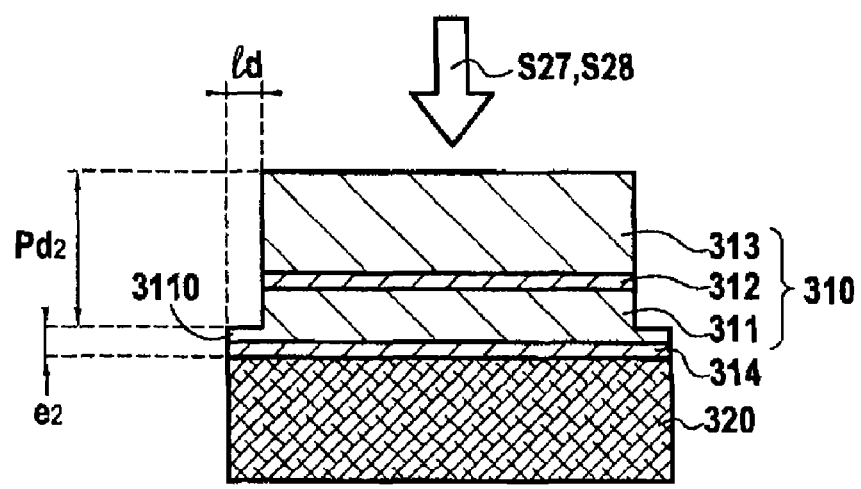
Figure 6F:
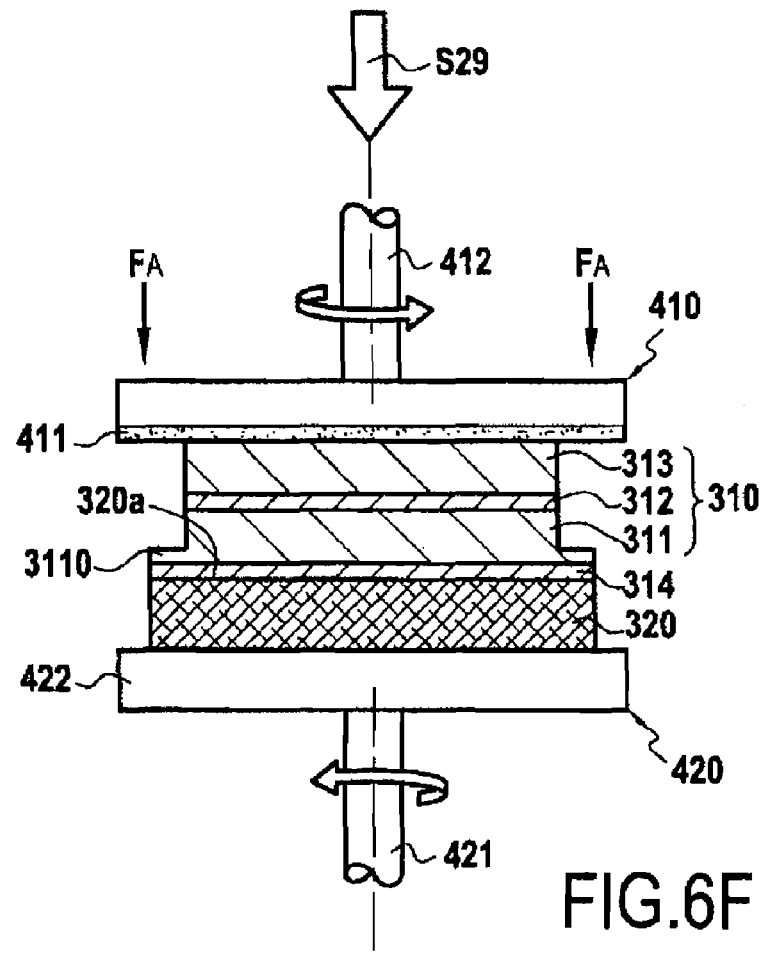
Figure 6G:
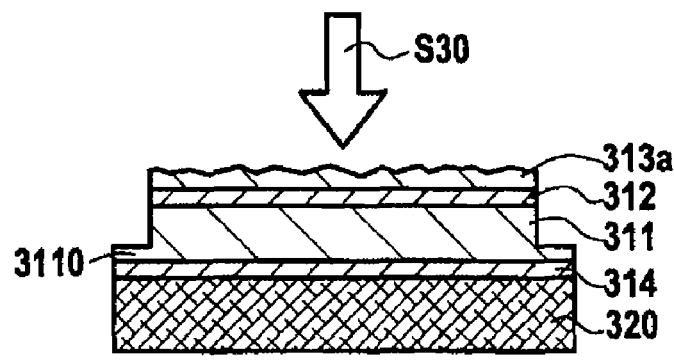

The trim of the first wafer 310 is then completed using a second trimming step carried out to a depth Pd2 in the first wafer 310 so as to further reduce the thickness of the annular portion 3110 to a second thickness e2 (step S27, FIG. 6E). Since the bond interface between the first and second wafer has already been strengthened by the first bond-strengthening anneal, the second trimming step may be carried out to a significant depth Pd2 without risking damage to the assembly. The thickness e2 of the annular portion 3110 after the second trimming step may be, in particular, smaller than or equal to 45 μm, or even zero.

A second bond-strengthening annealing step is then carried out (step S28). This second annealing step may be carried out at a temperature higher than that of the first anneal because the debonding stresses at the wafer edges are considerably reduced by the second trimming step. This second annealing step may be carried out at a temperature of between 200° C. and 250° C. and for a time of between 30 minutes and 4 hours.

The first and second trimming steps may each be carried out by continuous mechanical trimming, by gradual trimming or by hybrid trimming.

Next, the first wafer 310 is thinned so that a transferred layer corresponding to a portion of said first wafer is formed. The thinning is carried out firstly by grinding away most of the support 313 (step S29, FIG. 6F). In the same way as described above, the grinding is carried out using what is called a "coarse" grinding wheel 410, that is to say a wheel the grinding surface or active grinding part 411 of which comprises abrasive particles having an average size larger than 6.7 microns (or 2000 mesh), preferably larger than or equal to 15 microns (or 1000 mesh), and even more preferably larger than or equal to 31 microns (or 500 mesh). The two-wafer assembly is secured by the back side of the support substrate 320 using a chuck 420 comprising a plate 422 designed to secure the second wafer 320 using, for example, suction or an electrostatic system. During the grinding, the chuck 420 may be stationary whilst the wheel 410 is rotated about its axis 412. Alternatively, the chuck 420 may also rotate about an axis 421, the wheel 410 being made to rotate or not.

Because of the large size of the abrasive particles, the material of the first wafer 310 may be efficiently removed without having to apply the wheel 410 with an excessively large contact force FA on the assembly, reducing the risk that the two bonded wafers will delaminate. The grinding is stopped about 120 μm from the surface 320a of the sapphire support substrate.

Before the second, chemical thinning step, a post-grinding anneal may be carried out (step S30, FIG. 6G) so as to strengthen the bond and stop infiltration of the wet etchant into the bond interface during the second thinning step. Because a coarse grinding wheel is used during the grinding, the remaining part 313a of the support 313 has a work-hardened surface (FIG. 6G) which causes cracks to appear. To prevent the appearance of cracks, the post-grinding anneal is limited to a temperature of between 150° C. and 170° C. The post-grinding anneal is carried out for a time of between 30 minutes and 4 hours.

Figure 6H:
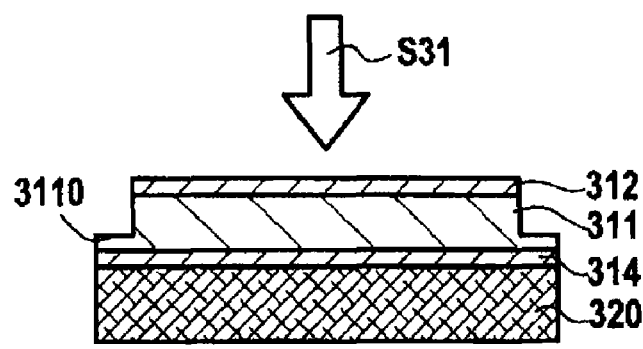
Figure 6I:
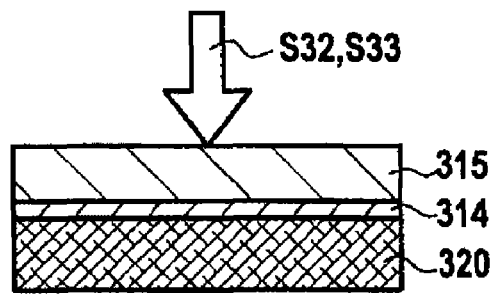
Figure 7:
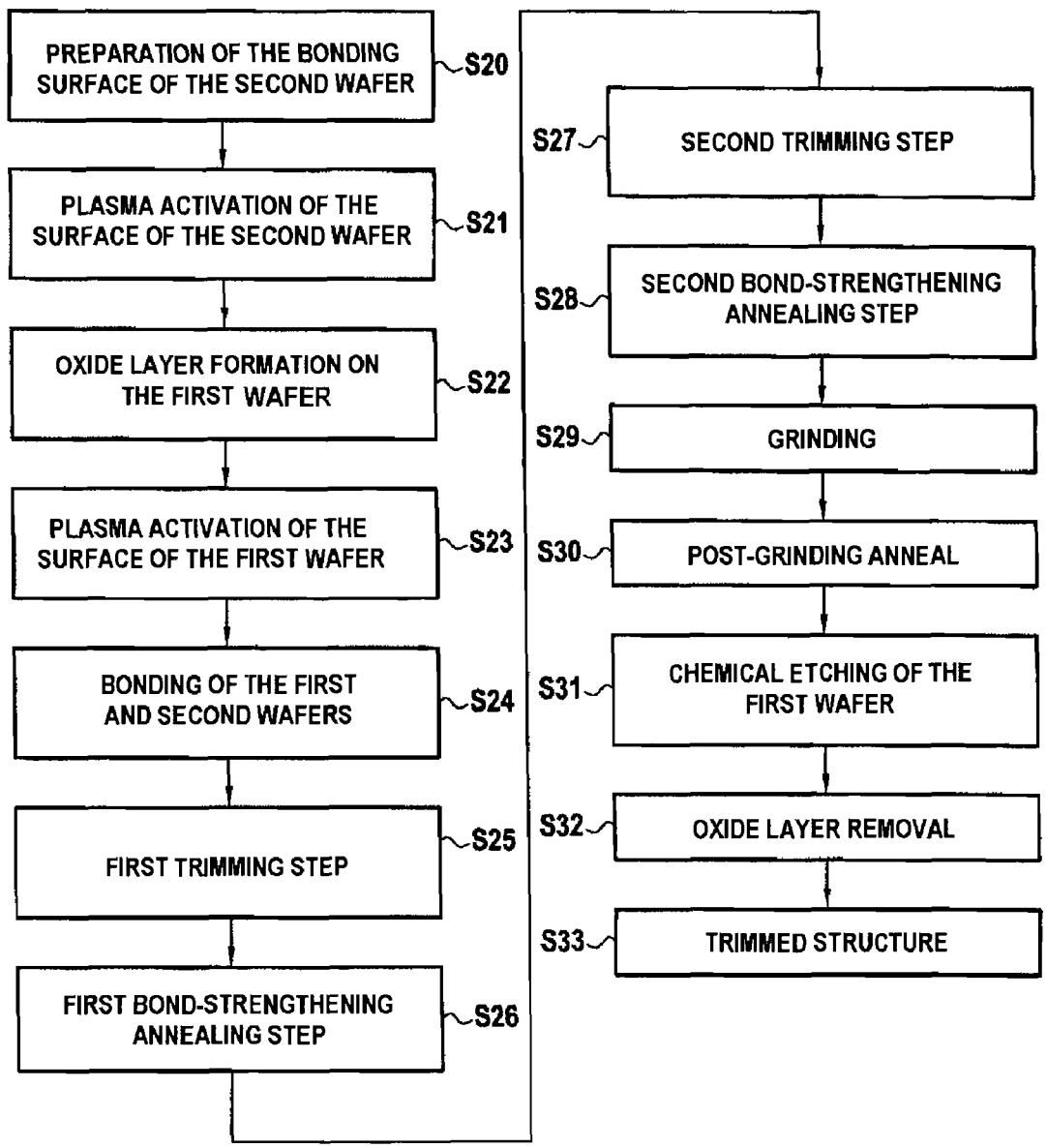
FIG. 7 is a flow diagram of the steps implemented during the fabrication of the heterostructure illustrated in FIGS. 6A to 6I.

The thinning of the initial substrate continues with an etch of the remaining portion 313a (step S31, FIG. 6H). This portion may be removed by chemical etching, also called wet etching, for example, by means of a TMAH (tetramethylammonium hydroxide) wet etch. The remaining portion 313a may also be removed by means of reactive ion etching.

The oxide layer 312 is used as an etch-stop layer. After the etch, the layer 312 may be removed (step S32, FIG. 6I), for example by HF deoxidation, so as to leave a transferred layer 315 corresponding to at least one part of the silicon layer 311. However, if required, the oxide layer 312 may be preserved.

This implementation of the process of the invention is particularly advantageous when the desired trim depth cannot be reached directly, in one step, without risking damage to the assembly. This implementation makes it possible in particular to avoid the problem of peel-off which, during a deep trim in an assembly with a weak bond interface, causes delamination of one of the two wafers in certain regions near the periphery of the wafers and which may be termed "macro peel-off".

What is claimed is:

1. A process for fabricating a heterostructure comprising:
bonding a first wafer to a second wafer, wherein the first wafer has a thermal expansion coefficient that is lower than the thermal expansion coefficient of the second wafer, and the first wafer has an edge;
conducting a first trimming step in which an annular portion at the edge of the first wafer is at least partially reduced in thickness; and
conducting at least one bond-strengthening annealing step after the first trimming step;
wherein the first trimming step is conducted after the bonding step and before thinning of the first wafer and remaining annular portion.

2. The process according to claim 1, wherein after the first trimming step, the first wafer has an annular edge portion with a thickness less than or equal to 55 μm.

3. A process for fabricating a heterostructure which comprises:
bonding a first wafer to a second wafer, wherein the first wafer has a thermal expansion coefficient that is lower than the thermal expansion coefficient of the second wafer, and the first wafer has an edge;
conducting a first trimming step in which an annular portion at the edge of the first wafer is at least partially reduced in thickness;
conducting at least one bond-strengthening annealing step;
conducting a second trimming step;
wherein the first trimming step is carried out after the bonding and before a first bond-strengthening annealing step, and the second trimming step is conducted after the first bond-strengthening annealing step but before a second bond-strengthening annealing step.

4. The process according to claim 3, wherein the second bond-strengthening annealing step is carried out at a higher temperature than the first bond-strengthening annealing step.

5. The process according to claim 1, wherein the first wafer is a silicon or SOI substrate.

6. The process according to claim 1, wherein the at least one bond-strengthening anneal has a boat-in temperature of the heterostructure lower than 80° C.

7. The process according to claim 1, wherein the at least one bond-strengthening anneal or anneals has a temperature ramp-up of about 1° C./min.

8. The process according to claim 1, which further comprises forming an oxide layer on the bonding surface of the first wafer before the bonding of the two wafers.

9. The process according to claim 1, which further comprises activating the bonding surface of at least one of the two wafers before bonding.

10. The process according to claim 1, which further comprises conducting a thinning step after the at least one bond-strengthening annealing step, so that a transferred layer corresponding to a portion of the first wafer is formed.

11. The process according to claim 10, wherein the second wafer is a sapphire substrate.

12. The process according to claim 11, wherein the thinning step comprises grinding followed by etching of the first wafer.

13. The process according to claim 12, wherein the grinding is conducted using a grinding wheel having a work surface which comprises abrasive particles with an average size larger than 6.7 microns.

14. The process according to claim 13, wherein the contact force of the grinding wheel on the first wafer is no greater than 222.5 Newtons.

15. A process for forming a transferred layer corresponding to a portion of a first wafer in a heterostructure, comprising:
forming a heterostructure by bonding first and second wafers together wherein the second wafer has a thermal expansion coefficient that is higher than the thermal expansion coefficient of the first wafer;
trimming only an annular portion of an edge of the first wafer so that the edge is at least partially reduced in thickness; and
conducting at least one bond-strengthening annealing step on the heterostructure after the first trimming step;
wherein the trimming is conducted after the bonding but before a thinning step of the first wafer and remaining annular portion.

16. The process according to claim 15, which further comprises:
a second trimming step;
a first bond-strengthening annealing step conducted before the thinning step; and
a second bond-strengthening annealing step;
wherein the second trimming step is conducted before the second annealing step.

17. The process according to claim 16; wherein the second bond-strengthening annealing step is carried out at a higher temperature than the first bond-strengthening annealing step.

18. The process according to claim 1, wherein the at least one bond-strengthening annealing step is carried out at a temperature of about 150 to 200° C. for a time of about 1 to 3 hours.

* * * * *